United States Patent
Takeda et al.

(10) Patent No.: US 6,861,198 B2
(45) Date of Patent: Mar. 1, 2005

(54) NEGATIVE RESIST MATERIAL AND PATTERN FORMATION METHOD USING THE SAME

(75) Inventors: Takanobu Takeda, Niigata (JP); Osamu Watanabe, Niigata (JP); Wataru Kusaki, Niigata (JP); Ryuji Koitabashi, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 35 days.

(21) Appl. No.: 10/351,097

(22) Filed: Jan. 23, 2003

(65) Prior Publication Data

US 2004/0023151 A1 Feb. 5, 2004

(30) Foreign Application Priority Data

Feb. 8, 2002 (JP) ........................................ 2000-032380

(51) Int. Cl.[7] .............................. G03C 1/72; C03F 7/033
(52) U.S. Cl. ................................. 430/270.1; 430/286.1; 430/296; 430/322; 430/330; 430/905; 430/942
(58) Field of Search ................... 430/270.1, 286.1, 430/296, 322, 330, 905, 942

(56) References Cited

U.S. PATENT DOCUMENTS 4,491,628 A    1/1985  Ito et al.

6,689,530 B2 *  2/2004  Ohsawa et al. ............. 430/170
2002/0081521 A1 *  6/2002  Takeda et al. ........... 430/270.1
2003/0180653 A1 *  9/2003  Ohsawa et al. ............. 430/170

FOREIGN PATENT DOCUMENTS

| EP | 499271 A1 * | 8/1992 | ........... G03F/7/038 |
| JP | 63-27829 | 2/1988 | |
| JP | 2-27660 | 6/1990 | |

* cited by examiner

*Primary Examiner*—Yvette C. Thornton
(74) *Attorney, Agent, or Firm*—Hogan & Hartson, LLP

(57) ABSTRACT

A negative resist material, which comprises at least a high polymer containing repeating units represented by the following general formula (1) and having a weight average molecular weight of 1,000 to 500,000. There is provided a negative resist material, in particular, a negative resist material of chemical amplification type, which shows high sensitivity, resolution, exposure latitude and process adaptability as well as good pattern shape after light exposure, and further shows superior etching resistance.

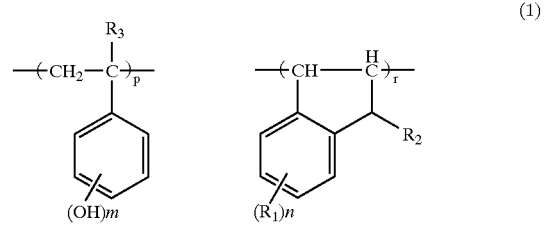

(1)

22 Claims, No Drawings

NEGATIVE RESIST MATERIAL AND PATTERN FORMATION METHOD USING THE SAME

BACKGROUND OF THE INVENTION

1. Field of the Invention

The present invention relates to a negative resist material formulated with, as a base resin, a high polymer that can be obtained by copolymerizing an indene that may have a substituent or another monomer showing solubility in alkaline or having a structure that can be converted into a functional group that shows solubility in alkaline by a deprotection reaction or the like, and deprotecting the resulting copolymer, which shows high contrast for dissolution rates before and after the exposure, high sensitivity, high resolution and superior etching resistance and is suitable as, in particular, a material for forming a micro pattern or mask pattern for the production of VLSI.

2. Related Art

In recent years, with use of higher integration degree and higher processing speed of LSI, finer pattern rules are being desired. Under such a situation, far ultraviolet ray lithography is considered promising as a fine processing technique of the next generation. The far ultraviolet ray lithography enables processing for even a line width of 0.5 µm or less, and it enables formation of a pattern having side walls approximately perpendicular to a substrate if a resist material showing a low light absorption is used.

The recently developed positive resist materials of chemical amplification type (refer to Japanese Patent Publication (Kokoku) No. 2-27660, Japanese Patent Laid-open Publication (Kokai) No. 63-27829 etc.) utilize a high luminance KrF excimer laser as a light source of far ultraviolet ray and have been developed as promising resist materials for the far ultraviolet ray lithography having superior characteristics such as high sensitivity, high resolution and high dry etching resistance.

However, in the electron ray lithography, which is currently noted as a processing technique for a line width of 0.1 µm or less, a negative resist material of chemical amplification type showing superior pattern size characteristics and so forth and containing a crosslinking agent attracts attentions and has become indispensable also as a mask pattern formation material. As for base resins of these resist materials, negative resist materials using a copolymer of hydroxystyrene and styrene or alkoxystyrene have been reported.

However, resist materials using such base resins as mentioned above have problems without exception. For example, the pattern shape is likely to become a bridge-like shape, a resin having a bulky group in an alkoxystyrene side chain shows lower heat resistance as well as insufficient sensitivity and resolution, and so forth.

In addition, as a problem in the production, while the base resins of these resist materials desirably have a weight average molecular weight of 7,000 or less, polymerization at an extremely low concentration is required for the currently available resists material, and thus the production efficiency is extremely poor.

Further, with use of higher resolution of 0.07 µm or less, patterns are also coming thinner. In connection with such a situation, there is desired a resist material having still higher etching resistance.

SUMMARY OF THE INVENTION

The present invention was accomplished in view of the aforementioned situation, and its object is to provide a negative resist material, in particular, a negative resist material of chemical amplification type, which shows higher sensitivity, resolution, exposure latitude and process adaptability compared with conventional negative resist materials, as well as good pattern shape after light exposure, and further shows superior etching resistance.

In order to achieve the aforementioned object, the present invention provides a negative resist material, which comprises at least a high polymer containing repeating units represented by the following general formula (1) and having a weight average molecular weight of 1,000 to 500,000.

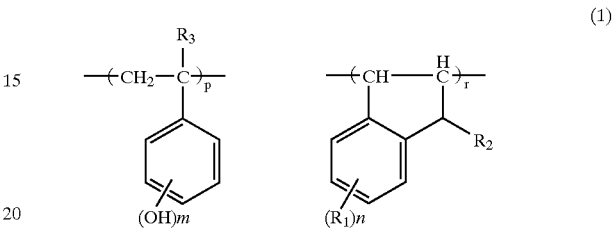

(1)

(In the formula, $R_1$ and $R_2$ each independently represent a hydrogen atom, a hydroxy group, a straight or branched alkyl group, an alkoxy group that may have a substituent or a halogen atom, and $R_3$ represents a hydrogen atom or a methyl group. Further, n represents 0 or a positive integer of 1 to 4, and m represents 0 or a positive integer of 1 to 5. p represents 0 or a positive number, and r represents a positive number.)

The present invention also provides a negative resist material, which comprises at least a high polymer containing repeating units represented by the following general formula (2) and having a weight average molecular weight of 1,000 to 500,000.

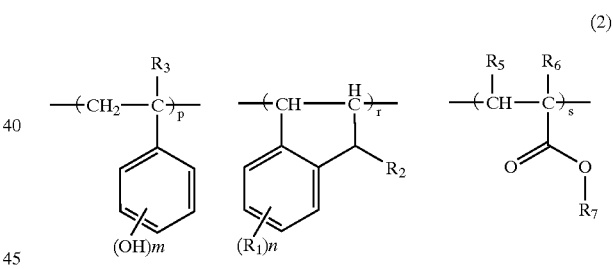

(2)

(In the formula, $R_1$ and $R_2$ each independently represent a hydrogen atom, a hydroxy group, a straight or branched alkyl group, an alkoxy group that may have a substituent or a halogen atom, $R_3$ and $R_5$ represent a hydrogen atom or a methyl group, $R_6$ represents a hydrogen atom, a methyl group, an alkoxycarbonyl group, a cyano group or a halogen atom, and $R_7$ represents an alkyl group that contains 1–20 carbon atoms and may have a substituent. Further, n represents 0 or a positive integer of 1 to 4, and m represents 0 or a positive integer of 1 to 5. Further, p and s represent 0 or a positive number, and r represents a positive number.)

Such negative resist materials containing the high polymer having repeating units represented by the aforementioned general formula (1) or (2) and having a weight average molecular weight of 1,000 to 500,000 as described above show high contrast for dissolution rates before and after the exposure, high sensitivity, high resolution and more superior etching resistance. Further, in addition to these superior characteristics, they are highly useful in practical use because of the high productivity of the resins, and thus they are extremely effective as resist materials for VLSI.

In the aforementioned resist materials, the high polymers containing the repeating units preferably contain both of the high polymer having a weight average molecular weight of 2,000 to 4,000 and the high polymer having a weight average molecular weight of 4,000 to 8,000.

If the aforementioned high polymers having different weight average molecular weights are mixed and formulated as described above, a still higher alkali dissolution rate contrast can be obtained.

Further, in the present invention, the negative resist materials may contain at least either of the high polymers as a base resin and further contain an organic solvent and a crosslinking agent.

If either of the aforementioned high polymers is used as a base resin, and an organic solvent and a crosslinking agent are further formulated as described above, the aforementioned high polymer undergoes crosslinking and its molecular weight increases in a light-exposed portion. Thus, the dissolution rate in a developer can surely be reduced.

In this case, the negative resist material of the present invention preferably further contains an acid generator so that the material should be a resist material of chemical amplification type.

If an acid generator is added to the resist material to utilize an acid catalyzed reaction as described above, the resist material can be a negative resist material of extremely high sensitivity and thus it can be a resist material extremely useful as a highly sensitive resist, which is required in recent years.

Further, in the present invention, a basic compound and/or a surfactant can be further formulated as additives.

By adding a basic compound, for example, the diffusion rate of the acid in the resist film can be suppressed to improve resolution, and by adding a surfactant, coatability of the resist material can be further improved or controlled.

Such negative resist materials of the present invention can be used in a method for forming a pattern on a semiconductor substrate, a mask substrate or the like by performing at least a step of applying the resist material to a substrate, a step of, after a heat treatment, exposing the resist material with a high energy ray or an electron beam, and a step of developing the exposed resist material by using a developer.

Of course, the development may be performed for the resist material that has heat-treated after the light exposure, and other various steps such as etching step, resist removal step and cleaning step may be performed.

As explained above, according to the present invention, a high polymer that can be obtained by copolymerizing an indene that may have a substituent, another monomer showing solubility in alkaline or another monomer having a structure that can be converted into a functional group that shows solubility in alkaline by a deprotection reaction or the like, and deprotecting the resulting copolymer is formulated in a negative resist material as a base resin. This enables provision of a negative resist material showing high contrast for alkali dissolution rates before and after the exposure, high sensitivity, high resolution and superior etching resistance, which is suitable as a material for forming a micro pattern or mask pattern for, in particular, the production of VLSI, with high productivity.

PREFERRED EMBODIMENTS OF THE INVENTION

Hereafter, embodiments of the present invention will be explained in detail. However, the present invention is not limited to these.

The inventors of the present invention assiduously studied in order to obtain a negative resist material showing high sensitivity, high resolution, higher exposure latitude and so forth, which are recently desired, as well as superior etching resistance. As a result, they found that, for that purpose, a high polymer containing repeating units represented by the following general formula (1) or (2) and having a weight average molecular weight of 1,000 to 500,000, which could be obtained by copolymerizing an indene that may have a substituent or another monomer showing solubility in alkaline or having a structure that can be converted into a functional group that shows solubility in alkaline by a deprotection reaction or the like, and deprotecting the resulting copolymer, was effective as a base resin of a negative resist material, especially negative resist material of chemical amplification type, and accomplished the present invention.

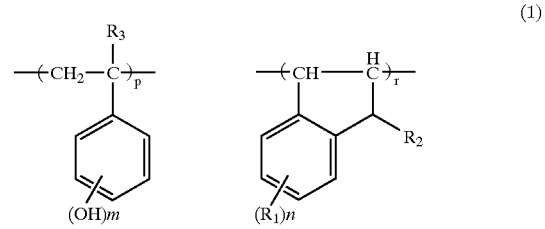

(1)

(In the formula, $R_1$ and $R_2$ each independently represent a hydrogen atom, a hydroxy group, a straight or branched alkyl group, an alkoxy group that may have a substituent or a halogen atom, and $R_3$ represents a hydrogen atom or a methyl group. Further, n represents 0 or a positive integer of 1 to 4, and m represents 0 or a positive integer of 1 to 5. p represents 0 or a positive number, and r represents a positive number.)

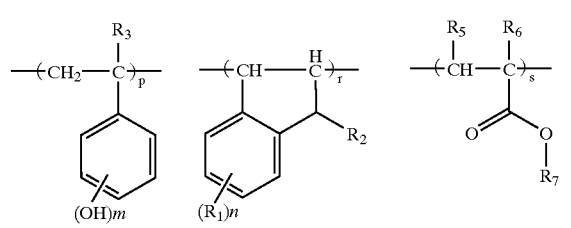

(2)

(In the formula, $R_1$ and $R_2$ each independently represent a hydrogen atom, a hydroxy group, a straight or branched alkyl group, an alkoxy group that may have a substituent or a halogen atom, $R_3$ and $R_5$ represents a hydrogen atom or a methyl group, $R_6$ represents a hydrogen atom, a methyl group, an alkoxycarbonyl group, a cyano group or a halogen atom, and $R^7$ represents an alkyl group that contains 1–20 carbon atoms and may have a substituent. Further, n represents 0 or a positive integer of 1 to 4, and m represents 0 or a positive integer of 1 to 5. Further, p and s represent 0 or a positive number, and r represents a positive number.)

By using such a high polymer as a base resin and suitably combining it with an organic solvent, a crosslinking agent, an acid generator, a basic compound, a surfactant and so forth depending on the purpose to prepare a negative resist material, the negative resist material shows high dissolution contrast of a resist film, high resolution, large exposure latitude and superior process adaptability as well as good pattern shape after light exposure, and further shows superior etching resistance, and the productivity of the base resin is also high. Therefore, the negative resist material can be one being practically useful and extremely effective as a resist material for VLSI. In particular, if an acid generator is added so that the material should be a negative resist material of chemical amplification type utilizing an acid catalyzed reaction, the material can show further higher sensitivity and more superior various characteristics, and thus it can be an extremely useful material.

Examples of the straight or branched alkyl group represented by $R_1$ or $R_2$ in the high polymers include methyl group, ethyl group, propyl group, isopropyl group, n-butyl group, iso-butyl group, tert-butyl group and so forth.

Further, when $R_1$ and $R_2$ represent a halogen atom, examples thereof include a fluorine atom, a chlorine atom and a bromine atom.

Further, although $R_1$, $R_2$ and $R_7$ may be selected from various groups, a group represented by the following general formula (3) or (4) is particularly preferred as a group that promotes a crosslinking reaction in the negative resist.

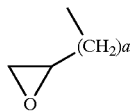

(3)

(In the formula, a represents an integer of 0 to 5.)

(4)

(In the formula, Z represents a hydroxy group, a fluorine atom, a chlorine atom or a bromine atom, and b represents an integer of 1 to 3.)

Specific examples of the group represented by the general formula (3) are epoxy group, epoxymethyl group and so forth.

Specific examples of the group represented by the general formula (4) are hydroxymethyl group, chloromethyl group, bromomethyl group and so forth.

In the aforementioned formula (1), p represents 0 or a positive number, and r represents a positive number. However, in view of the characteristics of the resist material, they are preferably numbers satisfying a relationship of $0.7 \leq p/(p+r)$. If $R_1$ is a hydroxy group, p may be 0. That is, this is because, if there are 70 percent or more of OH groups, it becomes easy to obtain contrast in alkali development.

In the aforementioned formula (2), p and s represent 0 or a positive number, and r represents a positive number. However, in view of the characteristics of the resist material, they are preferably numbers satisfying relationships of $0<r/(p+r+s) \leq 0.3$, more preferably $0.03<r/(p+r+s) \leq 0.15$, and $0 \leq s/(p+r+s) \leq 0.20$.

If r is 0, and thus the high polymer of the aforementioned formula (1) or (2) has a structure that does not contain that unit, the alkali dissolution rate of a non-light-exposed portion becomes too large, and thus sufficient contrast can no longer be obtained. Moreover, dry etching resistance cannot be improved.

By suitably selecting the values of p, r and s in the formulas (1) and (2) to be within the ranges defined above, dimensional control of pattern and control of pattern shape can be performed freely.

The high polymer of the present invention represented by the general formula (1) or (2) must have a weight average molecular weight (measurement method therefor will be described below) of 1,000 to 500,000, preferably 2,000 to 10,000. If the weight average molecular weight is too small, the characteristics of the resist material such as heat resistance are degraded, and if the weight average molecular weight is too large, the alkali solubility is reduced, and thus footing profile becomes likely to occur after the pattern formation.

Furthermore, as for the high polymers of the present invention, if, as the multi-component copolymer of the formula (1) or (2), the high polymer having a weight average molecular weight of 2,000 to 4,000 and the high polymer having a weight average molecular weight of 4,000 to 8,000 are formulated, further higher contrast can be obtained. The formulation ratio of the polymers is preferably 1:10 to 0.5, more preferably 1:2 to 0.7, wherein 1 represents the ratio of the high polymer having a weight average molecular weight of 4,000 to 8,000.

Further, in order to synthesize the high polymer of the present invention represented by the aforementioned general formula (1) or (2), as one method, acetoxystyrene monomers and indene monomers can be polymerized by heating in an organic solvent with addition of a radical initiator, and the obtained high polymer can be subjected to alkali hydrolysis in an organic solvent for deprotection of the acetoxy group to obtain a high polymer consisting of bi-component copolymer of hydroxystyrene and indene.

Examples of the organic solvent used for the polymerization include toluene, benzene, tetrahydrofuran, diethyl ether, dioxane and so forth. Examples of the polymerization initiator include 2,2'-azobisisobutyronitrile, 2,2'-azobis(2,4-dimethylvaleronitrile), dimethyl 2,2-azobis(2-methylpropionate), benzoyl peroxide, lauroyl peroxide, and so forth, and the polymerization can be preferably performed by heating at 50° C. to 80° C. The reaction time is 2 to 100 hours, preferably 5 to 20 hours. As the base for the alkali hydrolysis, aqueous ammonia, triethylamine and so forth can be used. Further, the reaction temperature therefor is −20° C. to 100° C., preferably 0° C. to 60° C., and the reaction time is 0.2 to 100 hours, preferably 0.5 to 20 hours.

However, the above explanation is a mere example, and the synthesis method is not limited to the aforementioned synthesis method.

Examples of the organic solvent formulated in the negative resist material of the present invention, in particular, negative resist material of chemical amplification type, include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrolidone, dimethyl sulfoxide, γ-butyrolactone, propylene glycol methyl ether acetate, propylene glycol ethyl ether acetate, propylene glycol propyl ether acetate, methyl lactate, ethyl lactate, propyl lactate, tetramethylenesulfone and so forth. However, the organic solvent is not limited to these.

Particularly preferred are a propylene glycol alkyl ether acetate and a lactic acid alkyl ester. These solvents can be used each alone or as a mixture of two or more kinds of them. Preferred examples of a mixed solvent are a mixture of a propylene glycol alkyl ether acetate and a lactic acid alkyl ester.

The alkyl group of the propylene glycol alkyl ether acetate used in the present invention is preferably an alkyl group having 1 to 4 carbon atoms such as methyl group, ethyl group and propyl group. Methyl group and ethyl group are especially preferred. The propylene glycol alkyl ether acetate include a 1,2-substituted compound and a 1,3-substituted compound, and include three kinds of isomers depending on the combination of the substitution positions. These isomers can be used each alone or as a mixture of two or more kinds of them.

The alkyl group of the lactic acid alkyl ester is preferably an alkyl group having 1 to 4 carbon atoms such as methyl group, ethyl group and propyl group. Methyl group and ethyl group are especially preferred.

When a propylene glycol alkyl ether acetate is added as a solvent, it is preferable to add it in an amount of 50% by weight or more with respect to the total amount of the solvent. When a lactic acid alkyl ester is added, it is preferable to add it in an amount of 50% by weight or more with respect to the total amount of the solvent. Further, when a mixed solvent of a propylene glycol alkyl ether acetate and a lactic acid alkyl ester is used as the solvent, it is preferable to add them in an amount as the total amount of them of 50% by weight or more with respect to the total amount of the solvent. In this case, the propylene glycol alkyl ether acetate is more preferably used in an amount of 60 to 95% by weight, and the lactic acid alkyl ester is more preferably used in an amount of 5 to 40% by weight. If the amount of the propylene glycol alkyl ether acetate is small, there are caused problems of degradation of coatability and so forth, and if it is too large, there are caused problems of insufficient dissolution, generation of particles and foreign matter and so forth. If the amount of the lactic acid alkyl ester is small, there are caused problems of insufficient dissolution, increase of particles and foreign matter and so forth, and if it is too large, viscosity becomes high, thus coatability is degraded, and in addition, there are caused problems of degradation of storage stability and so forth.

The addition amount of those solvents is 300 to 2,000 parts by weight, preferably 400 to 1,000 parts by weight, with respect to 100 parts by weight of the solid content of the negative resist material. However, so long as a concentration enabling film formation by a conventional film formation method is secured, the amount is not particularly limited to the ranges mentioned above.

The crosslinking agent formulated in the negative resist material of the present invention, especially the negative resist material of chemical amplification type, may be any one so long as it directly crosslinks the polymer in the molecule or molecules by light, or it crosslinks the polymer in the molecule or molecules by an acid generated by light when a photo acid generator is added to the negative resist material. Preferred crosslinking agents include bisazides, alkoxymethyl glycolurils and alkoxymethylmelamines.

Examples of the bisazides include 4,4'-diazidophenyl sulfide, bis(4-azidobenzyl)methane, bis(3-chloro-4-azidobenzyl)methane, bis-4-azidobenzylidene, 2,6-bis(4-azidobenzylidene)-cyclohexanone and 2,6-bis(4-azidobenzylidene)-4-methylcyclohexanone.

Example of the alkoxymethyl glycolurils include tetramethoxymethyl glycoluril, 1,3-bismethoxymethyl-4,5-bismethoxyethyleneurea and bismethoxymethylurea.

Examples of the alkoxymethylmelamines include hexamethoxymethylmelamine and hexaethoxymethylmelamine.

The addition amount of the crosslinking agent in the negative resist material of the present invention is 2 to 40 parts by weight, preferably 5 to 20 parts by weight, with respect to 100 parts by weight of the solid matter in the resist material. The aforementioned crosslinking agents may be used each alone or as a mixture of two or more kinds of them. Furthermore, it is also possible to use a crosslinking agent showing low transmittance for the light exposure wavelength to control the transmittance of the resist film with the addition amount of the crosslinking agent.

The photo acid generator formulated in the negative resist material of the present invention, especially the negative resist material of chemical amplification type, may be any one so long as it is a compound that generates an acid by irradiation with a high energy ray. Preferred photo acid generators include sulfonium salts, iodonium salts, sulfonyldiazomethane and N-sulfonyloxyimide type acid generators and so forth. Although detailed explanation will be made below, these may be used each alone or as a mixture of two or more kinds of them.

The sulfonium salts are salts of a sulfonium cation and sulfonate. Examples of the sulfonium cation include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium and so forth. Examples the sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate and so forth. Sulfonium salts consisting of a combination of these can be mentioned.

The iodonium salts are salts of an iodonium cation and sulfonate. Examples of the iodonium cation include aryliodonium cations such as diphenyliodonium, bis(4-tert-butylphenyl)iodonium, 4-tert-butoxyphenylphenyliodonium and 4methoxyphenylphenyliodonium, and examples of the sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate and so forth. Iodonium salts consisting of a combination of these can be mentioned.

Examples of the sulfonyldiazomethanes include bissulfonyldiazomethanes and sulfonylcarbonyldiazomethanes such as bis(ethylsulfonyl)diazomethane, bis(1- methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane and tert-butoxycarbonyl-4-methylphenylsulfonyldiazomethane.

Examples of the N-sulfonyloxyimide type photo acid generator include compounds consisting of a combination of an imide basic structure such as succinimide, naphthalenedicarboxylic acid imide, phthalic acid imide, cyclohexyldicarboxylic acid imide, 5-norbornene-2,3-dicarboxylic acid imide and 7-oxabicyclo[2.2.1]-5-heptene-2,3-dicarboxylic acid imide and trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate or the like.

Examples of the benzoin sulfonate type photo acid generator include benzoin tosylate, benzoin mesylate, benzoin butanesulfonate and so forth.

Examples of the pyrogallol trisulfonate type photo acid generator include compounds consisting of pyrogallol, phloroglycine, catechol, resorcinol or hydroquinone all of which hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate or the like.

Examples of the nitrobenzylsulfonate type photo acid generator include 2,4-dinitrobenzylsulfonate, 2-nitrobenzylsulfonate and 2,6-dinitrobenzylsulfonate, and specific examples of the sulfonate include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate and so forth. Moreover, compounds in which the nitro group on the benzyl side is replaced with trifluoromethyl group can be similarly used.

Examples of the sulfone type photo acid generator include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-(cyclohexylcarbonyl)-2-(p-toluenesulfonyl)propane, 2,4-dimethyl-2-(p-toluenesulfonyl)pentan-3-one and so forth.

Examples of the glyoxime derivative type photo acid generator include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexylsulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, bis-o-(camphorsulfonyl)-α-dimethylglyoxime and so forth.

Particularly preferably used photo acid generators among these are sulfonium salts, bissulfonyldiazomethanes and N-sulfonyloxyimides.

Although the optimum anion of the generated acid differs depending on reactivity of the crosslinking agent used for the resist and so forth, those not showing volatility and not showing extremely high diffusibility are generally selected. In this respect, preferred anions are benzenesulfonate anion, toluenesulfonate anion, 4-(4-toluenesulfonyloxy) benzenesulfonate anion, pentafluorobenzenesulfonate anion, 2,2,2-trifluoroethanesulfonate anion, nonafluorobutanesulfonate anion, heptadecafluorooctanesulfonate anion and camphorsulfonate anion.

The addition amount of the photo acid generator in the negative resist material of chemical amplification type of the present invention is 0.1 to 20 parts by weight, preferably 1 to 10 parts by weight, with respect to 100 parts by weight of the solid content in the resist material. The aforementioned photo acid generators can be used individually or as a mixture of two or more kinds of them. Furthermore, it is also possible to use a photo acid generator showing a low transmittance for the light exposure wavelength and control the addition amount thereof so as to control transmittance of the resist film.

As the chemical amplification type resist material referred to in the present invention, there will be mainly explained those containing a photo acid generator that generates an acid upon light exposure to obtain high sensitivity by utilizing an acid catalyzed reaction. However, the present invention is not limited to these. The present invention can of course be applied to any resist material in which a catalytic reaction is utilized in the chemical reaction upon light exposure to amplify the sensitivity, not limited to a chemical reaction utilizing an acid generator.

As the basic compound formulated in the negative resist material of the present invention, in particular, negative resist material of chemical amplification type, a compound that can reduce the diffusion rate of the acid generated by the photo acid generator upon diffusion of the acid in the resist film is suitable. By formulating such a basic compound, the diffusion rate of the acid in the resist film is reduced. This enables improvement of resolution, suppression of sensitivity fluctuation after the light exposure, reduction of dependency on substrate or environment, improvements of exposure latitude, pattern profile and so forth.

Examples of such a basic compound include primary, secondary and tertiary fatty amines, mixed amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, imide derivatives and so forth.

Specific examples of the primary fatty amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine and so forth, specific examples of the secondary fatty amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine and so forth, and specific examples of the tertiary fatty amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentaamine and so forth.

Further, examples of the mixed amine include, for example, dimethylethylamine, methylethylpropylamine, benzylamine, phenethylamine, benzyldimethylamine and so forth.

Specific examples of the aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole etc.), oxazole derivatives (e.g., oxazole, isoxazole etc.), thiazole derivatives (e.g., thiazole, isothiazole etc.), imidazole derivatives (e.g., imidazole, 4-methylimidazole, 4-methyl-2-phenylimidazole etc.), pyrazole derivatives, furazan derivatives, pyrroline derivatives (e.g., pyrroline, 2-methyl-1-pyrroline etc.), pyrrolidine derivatives (e.g., pyrrolidine, N-methylpyrrolidine, pyrrolidinone, N-methylpyrolidone etc.), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivative and so forth.

Furthermore, examples of the nitrogen-containing compounds having a carboxyl group include, for example, aminobenzoic acid, indolecarboxylic acid, amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine etc.), examples of the nitrogen-containing compounds having a sulfonyl group include 3-pyridinesulfonic acid, pyridinium p-toluenesulfonate and so forth, and examples of the nitrogen-containing compounds having a hydroxy group, the nitrogen-containing compounds having a hydroxyphenyl group and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyeurolysine, 3-quinuclidinol, 3-tropanol, 1-methyl-2-pyrrolidineethanol, 1-aziridineethanol, N-(2-hydroxyethyl)phthalimide, N-(2-hydroxyethyl)isonicotinamide and so forth.

Examples of the amide derivatives include formamide, N-methylformamide, N,N-dimethylformamide, acetamide, N-methylacetamide, N,N-dimethylacetamide, propionamide, benzamide and so forth.

Examples of the imide derivatives include phthalimide, succinimide, maleimide and so forth.

Furthermore, one or more kinds of basic compounds selected from those represented by the following general formula (5) can also be added.

$$N(X)_n(Y)_{3-n} \tag{5}$$

In the formula, n represents 1, 2 or 3. The side chains represented by X may be identical to or different from each other, and represented by the following general formulas (X)-1 to (X)-3. The side chains represented by Y may be identical to or different from each other, and be selected from a hydrogen atom or a straight, branched or cyclic alkyl group having 1 to 20 carbon atoms, which may contain an ether group or a hydroxyl group. Further, two of X may bond to each other to form a ring.

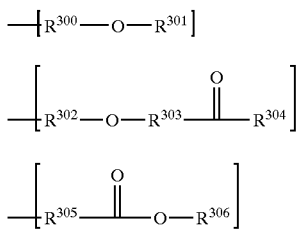

In the formulas, $R^{300}$, $R^{302}$ and $R^{305}$ represent a straight or branched alkylene group having 1 to 4 carbon atoms, and $R^{301}$ and $R^{304}$ represent a hydrogen atom or a straight, branched or cyclic alkyl group having 1–20 carbon atoms, which may contain one or more hydroxy groups, ether groups, ester groups or lactone rings. $R^{303}$ represents a single bond or a straight or branched alkylene group having 1 to 4 carbon atoms, and $R^{306}$ represents a straight, branched or cyclic alkyl group having 1–20 carbon atoms, which may contain one or more hydroxy groups, ether groups, ester groups or lactone rings.

Specific examples of the compound represented by the general formula (5) include the following compounds: tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-methoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxyethyl)2-(tetrahydrofurfuryloxycarbonyl)ethylamine, N,N-bis(2-hydroxyethyl)2-[(2-oxotetrahydrofuran-3-yl)oxycarbonyl]ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl)ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]}amine, N-(3-hydroxy-1-propyl)bis[2-(methoxycarbonyl)ethyl]amine, N-(3-acetoxy-1propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, β-(diethylamino)-δ-valerolactone and so forth, but not limited to these.

In addition, the basic compounds may be used each alone or in any combination of two or more of them. The formulation amount thereof is 0 to 2 parts by weight, particularly preferably 0.01 to 1 part by weight, with respect to 100 parts by weight of the solid content in the resist material. If the formulation amount exceeds 2 parts by weight, sensitivity may be unduly reduced.

The negative resist material of the present invention, especially the negative resist material of chemical amplification type may further contain a surfactant in order to improve coatability and so forth.

Example of the surfactant include, but not particularly limited to, nonionic surfactants, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkyl aryl ether such as polyoxyethylene octylphenyl ether and polyoxyethylene nonylphenyl ether, polyoxyethylene polyoxypropylene block copolymers, sorbitan fatty acid esters such as sorbitan monolaurate, sorbitan monopalmitate and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyehylene sorbitan trioleate and polyoxyethylene sorbitan tristearate, fluorochemical surfactants such as F-Top EF301, EF303, EF352 (Tochem Products), Megafac F171, F172, F173 (Dainippon Ink & Chemicals), Florard FC430, FC431 (Sumitomo 3M), Asahi Guard AG710, Serflon S-381, S-382, SC101, SC102, SC103, SC104, SC105, SC106, Surfynol E1004, KH-10, KH-20, KH-30 and KH-40 (Asahi Glass), organosiloxane polymers such as KP341, X-70-092 and X-70-093 (Shin-Etsu Chemical) and acrylic acid or methacrylic acid type surfactants such as Polyflow No. 75 and No. 95 (Kyoei Yusi Kagaku Kogyo). Among these, Florard FC430, Serflon S-381, Surfynol E1004, KH-20 and KH-30 are preferred. These surfactants may be used each alone or in any combination of two or more kinds of them.

The addition amount of the surfactant in the negative resist material of the present invention, especially the negative resist material of chemical amplification type, is 2 parts by weight or less, preferably 1 part by weight or less, with respect to 100 parts by weight of the solid content in the resist material composition.

When the negative resist material of the present invention, for example, the negative resist material of chemical amplification type containing an organic solvent, the high polymer represented by the general formula (1) or (2), a crosslinking agent, an acid generator, a basic compound and a surfactant, is used for manufacture of various integrated circuits, it can be used in, but not limited to, a known lithography technique.

For example, the negative resist material of the present invention is applied on a substrate for manufacture of integrated circuits etc. (Si, $SiO_2$, SiN, SiON, TiN, WSi, BPSG, SOG, organic antireflection coating etc.) or a blank for photo mask so that an applied thickness should become 0.2 to 2.0 $\mu$m by a suitable application method such as spin coating, roll coating, flow coating, dip coating, spray coating or doctor coating. This is pre-baked at 60° C. to 150° C. for 1 to 10 minutes, preferably at 80° C. to 120° C. for 1 to 5 minutes, on a hot plate. Subsequently, it is exposed directly or through a predetermined mask with a light source selected from a ultraviolet ray, far ultraviolet ray, electron beam, X-ray, excimer laser ray, γ ray, synchrotron radiation ray and so forth preferably at a wavelength of 300 nm or shorter in an objective pattern. The exposure is preferably performed with exposure of about 1 to 200 mJ/cm$^2$, preferably about 10 to 100 mJ/cm$^2$, for exposure with light, or about 0.1 to 20 $\mu$C/cm$^2$, preferably about 3 to 10 $\mu$C/cm$^2$, for exposure with electron beam. Then, the material is subjected to post-exposure baking (PEB) at 60° C. to 150° C. for 1 to 20 minutes, preferably at 80° C. to 120° C. for 1 to 10 minutes, on a hot plate.

Furthermore, the material is developed by a conventional method such as the dipping method, paddling method or spraying method for 0.1 to 3 minutes, preferably for 0.5 to 2 minutes, by using a developer consisting of an aqueous alkaline solution such as 0.1 to 5%, preferably 2 to 3%, tetramethylammonium hydroxide (TMAH) solution. Thus, since the aforementioned high polymer is crosslinked in an exposed portion of the resist film, such a portion is hardly dissolved by the developer, whereas an unexposed portion is dissolved, and thereby the desired pattern is formed on the substrate.

The material of the present invention is suitable for fine patterning utilizing a step of light exposure with a high energy ray or electron beam, in particular, a far ultraviolet ray of 254 to 193 nm, vacuum ultraviolet ray of 157 nm, electron beam, X-ray, soft X-ray, excimer laser ray, γ ray or synchrotron radiation ray among high energy rays.

EXAMPLES

Hereafter, the present invention will be specifically explained with reference to the following synthesis examples, comparative synthesis example, examples and comparative examples. However, the present invention is not limited to the following examples and so forth.

Synthesis Example 1

To a 500-mL flask, 96.4 g of acetoxystyrene, 103.6 g of indene and 20 g of toluene as a solvent were added. This reaction vessel was cooled to −70° C. under a nitrogen atmosphere, and degassing under reduced pressure and introduction of a nitrogen flow were repeated three times. After the reaction solution was warmed to room temperature, it was added with 9.8 g of AIBN as a polymerization initiator, warmed to 55° C. and then allowed to react for 25 hours. This reaction solution was concentrated to ½ volume and precipitated in 5.0 L of a methanol solution, and the obtained white solid was taken by filtration and dried under reduced pressure at 40° C. to obtain 111 g of white polymer. This polymer was dissolved again in 0.3 L of methanol and 0.3 L of tetrahydrofuran, added with 70 g of triethylamine and 15 g of water to perform deprotection reaction and neutralized by using acetic acid. The reaction solution was concentrated, then dissolved in 0.5 L of acetone and subjected to precipitation, filtration and drying in the same manner as described above to obtain 77 g of white polymer.

The obtained polymer was subjected to $^{13}$C and $^1$H-NMR and GPC analysis, and the following analysis results were obtained.
Copolymerization ratio: hydroxystyrene:indene=80.3:19.7
Weight average molecular weight (Mw)=5000
Molecular weight distribution (Mw/Mn)=1.96
This high polymer was designated as (poly-A).

Synthesis Example 2

To a 500-mL flask, 126.1 g of acetoxystyrene, 73.9 g of indene and 180 g of toluene as a solvent were added. This reaction vessel was cooled to −70° C. under a nitrogen atmosphere, and degassing under reduced pressure and introduction of a nitrogen flow were repeated three times. After the reaction solution was warmed to room temperature, it was added with 18.6 g of AIBN as a polymerization initiator, warmed to 57° C. and allowed to react for 25 hours. This reaction solution was concentrated to ½ volume and precipitated in 5.0 L of a methanol solution, and the obtained white solid was taken by filtration and dried under reduced pressure at 40° C. to obtain 129 g of white polymer. This polymer was dissolved again in 0.3 L of methanol and 0.3 L of tetrahydrofuran, added with 70 g of triethylamine and 15 g of water to perform deprotection reaction and neutralized by using acetic acid. The reaction solution was concentrated, then dissolved in 0.5 L of acetone and subjected to precipitation, filtration and drying in the same manner as described above to obtain 86 g of white polymer.

The obtained polymer was subjected to $^{13}$C and $^1$H-NMR and GPC analysis, and the following analysis results were obtained.
Copolymerization ratio: hydroxystyrene:indene=87.1:12.9
Weight average molecular weight (Mw)=3400
Molecular weight distribution (Mw/Mn)=1.88
This high polymer was designated as (poly-B).

Synthesis Example 3

To a 2-L flask, 111.5 g of acetoxystyrene, 58.0 g of indene, 20.3 g of methacrylic acid epoxymethyl ester and 120 g of toluene as a solvent were added. This reaction vessel was cooled to −70° C. under a nitrogen atmosphere, and degassing under reduced pressure and introduction of a nitrogen flow were repeated three times. After the reaction solution was warmed to room temperature, it was added with 9.7 g of AIBN as a polymerization initiator, warmed to 57° C. and then allowed to react for 25 hours. This reaction solution was concentrated to ½ volume and precipitated in a mixed solution of 4.5 L of methanol and 0.5 L of water, and the obtained white solid was taken by filtration and dried under reduced pressure at 60° C. to obtain 135 g of white polymer. This polymer was dissolved again in 0.3 L of methanol and 0.3 L of tetrahydrofuran, added with 70 g of triethylamine and 15 g of water to perform deprotection reaction and neutralized by using acetic acid. The reaction solution was concentrated, then dissolved in 0.5 L of acetone and subjected to precipitation, filtration and drying in the same manner as described above to obtain 94.5 g of white polymer.

The obtained polymer was subjected to $^{13}C$ and $^1$H-NMR and GPC analysis, and the following analysis results were obtained.

Copolymerization ratio: hydroxystyrene:indene:methacrylic acid epoxymethyl ester=84.8:7.2:8.0
Weight average molecular weight (Mw)=4800
Molecular weight distribution (Mw/Mn)=1.89

This high polymer was designated as (poly-C).

Synthesis Example 4

To a 2-L flask, 110.3 g of acetoxystyrene, 59.1 g of indene, 19.2 g of methacrylic acid hydroxyethyl ester and 120 g of toluene as a solvent were added. This reaction vessel was cooled to −70° C. under a nitrogen atmosphere, and degassing under reduced pressure and introduction of a nitrogen flow were repeated three times. After the reaction solution was warmed to room temperature, it was added with 9.7 g of AIBN as a polymerization initiator, warmed to 57° C. and then allowed to react for 25 hours. This reaction solution was concentrated to ½ volume and precipitated in a mixed solution of 4.5 L of methanol and 0.5 L of water, and the obtained white solid was taken by filtration and then dried under reduced pressure at 60° C. to obtain 138 g of white polymer. This polymer was dissolved again in 0.3 L of methanol and 0.3 L of tetrahydrofuran, added with 70 g of triethylamine and 15 g of water to perform deprotection reaction and neutralized by using acetic acid. The reaction solution was concentrated, then dissolved in 0.5 L of acetone and subjected to precipitation, filtration and drying in the same manner as described above to obtain 96.6 g of white polymer.

The obtained polymer was subjected to $^{13}C$ and $^1$H-NMR and GPC analysis, and the following analysis results were obtained.

Copolymerization ratio: hydroxystyrene:indene:methacrylic acid hydroxyethyl ester=84.2:8.2:7.6
Weight average molecular weight (Mw)=5100
Molecular weight distribution (Mw/Mn)=1.90

This high polymer was designated as (poly-D).

Comparative Synthesis Example

Designation and analysis results of a ternary polymer synthesized by a method similar to those used in the aforementioned synthesis examples are shown below.

Copolymerization ratio: hydroxystyrene:styrene:methoxystyrene=83.9:6.0:10.1
Weight average molecular weight (Mw)=8900
Molecular weight distribution (Mw/Mn)=1.85

This high polymer was designated as (poly-E).

Structures of the synthesized high polymers are shown below.

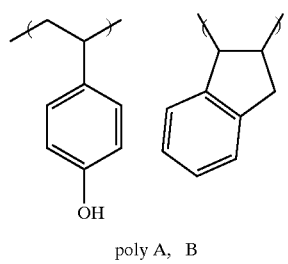

poly A, B

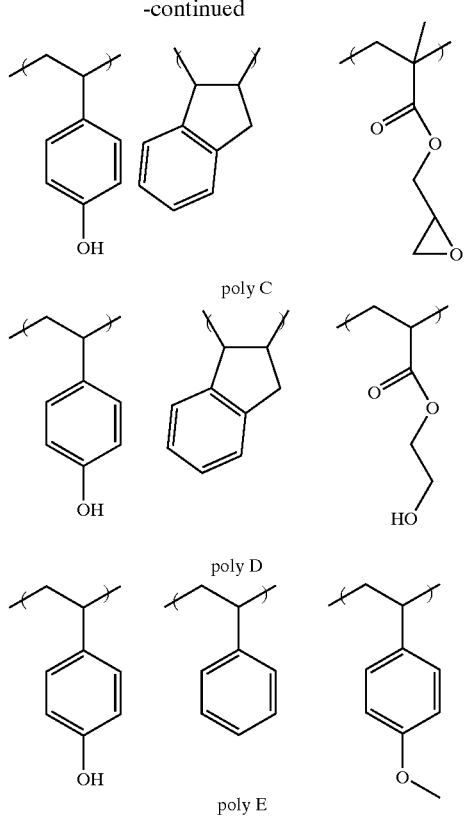

poly C poly D poly E

Examples, Comparative Examples

Negative resist materials shown Table 1 mentioned below were prepared by using the high polymers synthesized above. The numerals mentioned in Table 1 indicate the weight ratios of the mixed components. The components mentioned in Table 1 are as follows.

Polymer A (poly-A): hydroxystyrene/indene copolymer (obtained in Synthesis Example 1)
Polymer B (poly-B): hydroxystyrene/indene copolymer (obtained in Synthesis Example 2)
Polymer C (poly-C): hydroxystyrene/indene/methacrylic acid epoxymethyl ester copolymer (obtained in Synthesis Example 3)
Polymer D (poly-D): hydroxystyrene/indene/methacrylic acid hydroxyethyl ester copolymer (obtained in Synthesis Example 4)
Polymer E (poly-E): hydroxystyrene/styrene/methoxystyrene copolymer (obtained in Comparative Synthesis Example)
Crosslinking agent 1: tetramethoxymethyl glycoluril
Crosslinking agent 2: hexamethoxymethylmelamine
PAG1: 4-(4'-methylphenylsulfonyloxy)phenylsulfonic acid triphenylsulfonium
PAG2: bis(tert-butylsulfonyl)diazomethane
PAG3: (n-butylsulfonyl)-5-norbornene-2,3-dicarboxylic acid imide
Basic compound A: tri-n-butylamine
Basic compound B: tris(2-methoxyethyl)amine
Surfactant A: FC-430 (Sumitomo 3 M)
Surfactant B: Serflon S-381 (Asahi Glass)
Solvent A: Propylene glycol methyl ether acetate
Solvent B: ethyl lactate

TABLE 1

| | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Polymer A | 100 | 100 | | | | 50 | 80 | 50 | | |
| Polymer B | | | 100 | | | 50 | | | | |
| Polymer C | | | | 100 | | | 20 | | | |
| Polymer D | | | | | 100 | | | 50 | | |
| Polymer E | | | | | | | | | 100 | 100 |
| Crosslinking agent 1 | 10 | | 10 | 10 | 10 | | | | 10 | |
| Crosslinking agent 2 | | 10 | | | | 10 | 10 | 10 | | 10 |
| PAG 1 | 5 | | 5 | 5 | 5 | | | 5 | 5 | |
| PAG 2 | | | | | | | | 2 | | |
| PAG 3 | | 15 | | | | 15 | 15 | | | 15 |
| Basic compound A | 0.15 | | 0.15 | 0.15 | 0.15 | | | | 0.15 | |
| Basic compound B | | 0.3 | | | | 0.3 | 0.3 | 0.3 | | 0.3 |
| Surfactant A | 0.1 | | 0.1 | 0.1 | 0.1 | | | 0.05 | 0.1 | |
| Surfactant B | | 0.1 | | | | 0.1 | 0.1 | 0.05 | | 0.1 |
| Solvent A | 240 | 660 | 240 | 240 | 240 | 330 | 330 | 240 | 240 | 660 |
| Solvent B | 420 | 0 | 420 | 420 | 420 | 330 | 330 | 420 | 420 | 0 |

Each of the obtained resist materials was filtered through a 0.2-μm fluororesin filter, and the resist solution was coated on a silicon wafer by spin coating with a thickness of 0.4 μm.

Subsequently, the silicon wafer was baked for 4 minutes on a hot plate at 100° C. Furthermore, the coated wafer was exposed to light by using an electron beam exposure apparatus (ELS-3700, Elionix, accelerating voltage: 30 keV), baked (PEB: post exposure bake) at 110° C. for 4 minutes and developed with an aqueous solution of 2.38% tetramethylammonium hydroxide. As a result, a negative pattern was obtained (Examples 1 to 8, Comparative Examples 1 and 2).

Each of the obtained resist patterns was evaluated as follows.

Exposure resolving the top and bottom of 0.20 μm lines and spaces in a ratio of 1:1 was used as optimum exposure (sensitivity: Eop), and resolution of a resist to be evaluated was determined as a minimum line width of line and space separated with that exposure. Further, as for the shape of the resolved resist pattern, a cross section of the resist was observed by using a scanning electron microscope.

Further, as etching resistance, reduction of the coated resist film along the thickness direction during dry etching with $CHF_3$: $CF_4$=1:1 for 2 minutes was measured for comparison of the resistance. In this case, a smaller reduction indicates higher resistance.

Solubility of the resist material in a mixed solvent was determined based on visual inspection and presence of clogging during filtration.

Storage stability was determined based on deposition of dust particles or sensitivity fluctuation with time. As for the dust particles, when 5 or less particles of 0.3 μm or more were contained in 1 ml of the resist solution as counted by using a particle counter (KL-20A, Rion) or sensitivity fluctuation relative to the sensitivity immediately after the production (Eop mentioned above) was 5% or less for 100 days as the longest observation period, the result was determined to be good. The count of particles or sensitivity fluctuation was out of the ranges defined above, the result was determined to be bad.

Dust particles appearing on the pattern after the development were observed by using a scanning electron microscope (TDSEM: S-7280H, Hitachi). When number of dust particles in 100 square micrometers observed by visual inspection was 10 or less, the result was determined to be good, when the number was 11 to 15, the result was determined to be slightly bad, and when the number exceeded that range, the result was determined to be bad.

Dust particles appearing after delamination of the resist were observed by using Surfscan (Surfscan 6220, Tencor Instruments). When number of dust particles of 0.20 μm or more on a 8-inch wafer was 100 or less, the result was determined to be good, when the number was 101 to 150, the result was determined to be slightly bad, and when the number is 151 or more, the result was determined to be bad.

The results are shown in Table 2 mentioned below.

TABLE 2

| | Eop (μC/cm$^2$) | Critical resolution (μm) | Reduction of etching amount (Å) | Solubility | Storage stability | Dust particles on pattern | Dust particle after delamination of resist |
|---|---|---|---|---|---|---|---|
| Example 1 | 4.5 | 0.08 | 795 | Good | Good | Good | Good |
| Example 2 | 6 | 0.09 | 812 | Good | Good | Good | Good |
| Example 3 | 4.8 | 0.08 | 802 | Good | Good | Good | Good |
| Example 4 | 4.7 | 0.08 | 805 | Good | Good | Good | Good |
| Example 5 | 4.6 | 0.08 | 807 | Good | Good | Good | Good |
| Example 6 | 6 | 0.07 | 811 | Good | Good | Good | Good |

TABLE 2-continued

|  | Eop ($\mu C/cm^2$) | Critical resolution ($\mu m$) | Reduction of etching amount (Å) | Solubility | Storage stability | Dust particles on pattern | Dust particle after delamination of resist |
|---|---|---|---|---|---|---|---|
| Example 7 | 5.8 | 0.09 | 813 | Good | Good | Good | Good |
| Example 8 | 4.5 | 0.08 | 819 | Good | Good | Good | Good |
| Comparative Example 1 | 6.8 | 0.14 | 880 | Good | Good | Slightly bad | Slightly bad |
| Comparative Example 2 | 8 | 0.18 | 892 | Good | Good | Bad | Bad |

As clearly seen from the results shown in Table 2, when the lithography was performed by using the negative resist materials of photo amplification type of the present invention, there were obtained good sensitivity, high resolution and high etching resistance as well as good results as for solubility, storage stability and dust particles. In addition, high productivity could be attained in the synthesis of the high polymers of the present invention, and thus they enabled supply of negative resist materials at a low cost.

The present invention is not limited to the embodiments described above. The above-described embodiments are mere examples, and those having the substantially same configurations as that described in the appended claims and providing the similar functions and advantages are included in the scope of the present invention.

For example, although the above explanations were made for the cases where the negative resist materials of chemical amplification type were produced by formulating a negative resist materials with an acid generator, basic compound and surfactant, the present invention is not limited to them, and the addition of these additives and so forth is optional. Negative resist materials containing at least the high polymer represented by the aforementioned general formula (1) or (2) having a defined weight average molecular weight all fall within the scope of the present invention.

What is claimed is:

1. A negative resist material, which comprises at least a high polymer containing repeating units represented by the following general formula (1) and having a weight average molecular weight of 1,000 to 500,000:

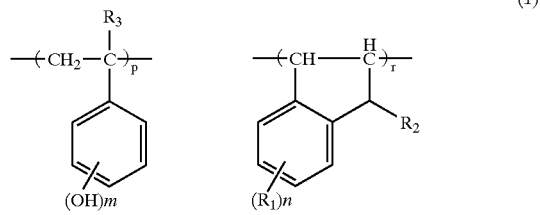

(1)

wherein $R_1$ and $R_2$ each independently represent a hydrogen atom, a hydroxy group, a straight or branched alkyl group, an alkoxy group that may have a substituent or a halogen atom, $R_3$ represents a hydrogen atom or a methyl group, n represents 0 or a positive integer of 1 to 4, m represents a positive integer of 1 to 5, p represents a positive number, and r represents a positive number.

2. The negative resist material according to claim 1, wherein the high polymer containing the repeating units contains both of the high polymer having a weight average molecular weight of 2,000 to 4,000 and the high polymer having a weight average molecular weight of 4,000 to 8,000.

3. The negative resist material according to claim 2, which contains at least the high polymer as a base resin and further contains an organic solvent and a crosslinking agent.

4. The negative resist material according to claim 3, which further contains an acid generator, and is a resist material of chemical amplification type.

5. The negative resist material according to claim 4, which further contains a basic compound and/or a surfactant as additives.

6. The negative resist material according to claim 3, which further contains a basic compound and/or a surfactant as additives.

7. The negative resist material according to claim 1, which contains at least the high polymer as a base resin and further contains an organic solvent and a crossliniking agent.

8. The negative resist material according to claim 7, which further contains an acid generator, and is a resist material of chemical amplification type.

9. The negative resist material according to claim 8, which further contains a basic compound and/or a surfactant as additives.

10. The negative resist material according to claim 7, which further contains a basic compound and/or a surfactant as additives.

11. A method for pattern formation, which comprises at least a step of applying the resist material according to claim 1 to a substrate, a step of, after a heat treatment, exposing the resist material with a high energy ray or an electron beam, and a step of developing the exposed resist material by using a developer.

12. A negative resist material, which comprises at least a high polymer containing repeating units represented by the following general formula (2) and having a weight average molecular weight of 1,000 to 500,000:

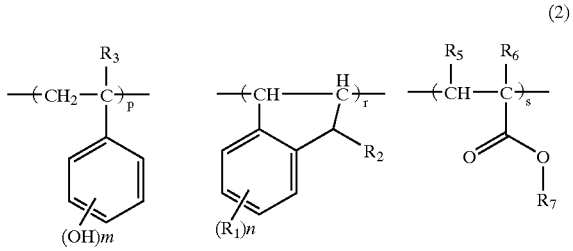

(2)

wherein $R_1$ and $R_2$ each independently represent a hydrogen atom, a hydroxy group, a straight or branched alkyl group, an alkoxy group that may have a substituent or a halogen atom, $R_3$ and $R_5$ represent a hydrogen atom or a methyl group, $R_6$ represents a hydrogen atom, a methyl group, an alkoxycarbonyl group, a cyano group or a halogen atom, $R_7$ represents an alkyl group that contains 1–20 carbon atoms and may have a substituent, n represents 0 or a positive integer of 1 to 4, m represents a positive integer of 1 to 5, p and s represent a positive number, and r represents a positive number.

13. The negative resist material according to claim 12, wherein the high polymer containing the repeating units contains both of the high polymer having a weight average molecular weight of 2,000 to 4,000 and the high polymer having a weight average molecular weight of 4,000 to 8,000.

14. The negative resist material according to claim 13, which contains at least the high polymer as a base resin and further contains an organic solvent and a crosslinking agent.

15. The negative resist material according to claim 14, which further contains an acid generator, and is a resist material of chemical amplification type.

16. The negative resist material according to claim 15, which further contains a basic compound and/or a surfactant as additives.

17. The negative resist material according to claim 14, which further contains a basic compound and/or a surfactant as additives.

18. The negative resist material according to claim 12, which contains at least the high polymer as a base resin and further contains an organic solvent and a crosslinking agent.

19. The negative resist material according to claim 18, which further contains an acid generator, and is a resist material of chemical amplification type.

20. The negative resist material according to claim 19, which further contains a basic compound and/or a surfactant as additives.

21. The negative resist material according to claim 18, which further contains a basic compound and/or a surfactant as additives.

22. A method for pattern formation, which comprises at least a step of applying the resist material according to claim 12 to a substrate, a step of, after a heat treatment, exposing the resist material with a high energy ray or an electron beam, and a step of developing the exposed resist material by using a developer.

* * * * *